United States Patent

Banich et al.

Patent Number: 6,104,587
Date of Patent: *Aug. 15, 2000

[54] ELECTRICAL DEVICE COMPRISING A CONDUCTIVE POLYMER

[76] Inventors: Ann Banich, 2014 Mills Ave., Menlo Park, Calif. 94025; Edward F. Chu, 1714 Banff Dr., Sunnyvale, Calif. 94087

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/900,887

[22] Filed: Jul. 25, 1997

[51] Int. Cl.$^7$ ................................................. H02H 5/04
[52] U.S. Cl. ........................... 361/106; 361/58; 338/22 R
[58] Field of Search ................................ 361/103, 106, 361/58; 338/22 R, 22 SD; 219/485

[56] References Cited

U.S. PATENT DOCUMENTS

| | | | |
|---|---|---|---|
| 4,237,441 | 12/1980 | van Konynenburg et al. | 338/22 R |
| 4,426,633 | 1/1984 | Taylor | 338/25 |
| 4,545,926 | 10/1985 | Fouts, Jr. et al. | 252/511 |
| 4,689,475 | 8/1987 | Kleiner et al. | 219/553 |
| 4,724,417 | 2/1988 | Au et al. | 338/22 R |
| 4,774,024 | 9/1988 | Deep et al. | 252/511 |
| 4,800,253 | 1/1989 | Kleiner et al. | 219/553 |
| 4,849,133 | 7/1989 | Yoshida et al. | 252/511 |
| 4,935,156 | 6/1990 | van Konynenburg et al. | 219/553 |
| 5,049,850 | 9/1991 | Evans | 338/22 R |
| 5,093,898 | 3/1992 | van Konynenburg et al. | 392/451 |
| 5,241,741 | 9/1993 | Sugaya | 29/612 |
| 5,250,228 | 10/1993 | Baigrie et al. | 252/511 |
| 5,378,407 | 1/1995 | Chandler et al. | 252/513 |
| 5,382,938 | 1/1995 | Hansson et al. | 338/22 R |
| 5,451,919 | 9/1995 | Chu et al. | 338/22 R |
| 5,582,770 | 12/1996 | Chu et al. | 252/511 |
| 5,645,746 | 7/1997 | Walsh | 219/505 |
| 5,747,147 | 5/1998 | Wartenberg et al. | 428/209 |
| 5,801,612 | 9/1998 | Chandler et al. | 338/22 R |
| 5,874,885 | 2/1999 | Chandler et al. | 338/22 |

FOREIGN PATENT DOCUMENTS

| | | | |
|---|---|---|---|
| 0363746 | 4/1990 | European Pat. Off. | H02H 3/08 |
| 0460790 | 12/1991 | European Pat. Off. | H01B 1/24 |
| 94/06128 | 3/1994 | WIPO | H01C 7/02 |
| 96/36057 | 11/1996 | WIPO | H01C 7/02 |

OTHER PUBLICATIONS

Patent Abstracts of Japan vol. 014, No. 225 (E–0927), May 14, 1990 & JP 02 058201A, (Matsushita Electric Ind. Co. Ltd.), Feb. 27, 1990 (abstract only).

Search Report for International Application No. PCT/US98/14956, mailed Oct. 13, 1998.

U.S. application No. 08/798,887 (Toth et al.), filed Feb. 10, 1997.

U.S. application No. 08/816,471 (Chandler et al.), filed Mar. 13, 1997.

Primary Examiner—Michael J. Sherry

[57] ABSTRACT

An electrical device which includes a resistive element which exhibits PTC behavior, is composed of a conductive polymer composition, has a planar shape with first and second major surfaces, and has a thickness of at most 0.64 mm. The resistive element is sandwiched between first and second metal foil electrodes, at least one of which has a thickness of at least 0.055 mm, so that the ratio of the resistive element thickness to electrode thickness is 1:1 to 16:1. The device can be used as a circuit protection device in an electrical circuit.

7 Claims, 1 Drawing Sheet

ELECTRICAL DEVICE COMPRISING A CONDUCTIVE POLYMER

BACKGROUND OF THE INVENTION

1. Field of the Invention

This invention relates to electrical devices comprising conductive polymers, and electrical circuits comprising such devices.

2. Introduction to the Invention

Conductive polymer compositions which exhibit PTC (positive temperature coefficient of resistance) behavior are well-known for use in electrical devices such as circuit protection devices and heaters. Such compositions with low resistivity are desirable for use in circuit protection devices which respond to changes in ambient temperature and/or current conditions. Under normal conditions, a circuit protection device remains in a low temperature, low resistance state in series with a load in an electrical circuit. When exposed to an overcurrent or overtemperature condition, however, the device increases in resistance, effectively shutting down the current flow to the load in the circuit. For many applications it is desirable that the device have as low a resistance as possible in order to minimize the effect on the resistance of the electrical circuit during normal operation. Furthermore, a low resistance allows the device to have a higher hold current, i.e. the largest steady state current that, under specified ambient conditions, can be passed through a circuit protection device without causing the device to "trip" into the high resistance state. Although low resistance devices can be made from a given composition by changing dimensions, e.g. making the distance between the electrodes very small or the device area very large, small devices are preferred. Such devices occupy less space on a circuit board and generally have desirable thermal properties. The most common technique to achieve a small device is to use a composition that has a low resistivity.

BRIEF SUMMARY OF THE INVENTION

A simple circuit protection device comprises a resistive element sandwiched between two metal foil electrodes. Although such a device is useful for some applications, e.g. inserted onto a battery terminal or between spring clips on a motor, for most applications, it is necessary that electrical leads capable of insertion onto a circuit board or into a circuit be attached, e.g. by soldering or welding, to the electrodes. Furthermore, it is often necessary to electrically insulate the resistive element and the electrodes, e.g. by an encapsulant or other insulating material. The processing steps associated with lead attachment and/or encapsulation can result in resistance increases in the devices, as well as delamination of the electrodes due to expansion and contraction of the conductive polymer as a result of exposure to high temperatures, particularly temperatures above the melting point of the polymer.

We have now found that a particular combination of resistive element thickness and metal foil electrode thickness provide a device which has good electrical performance without delamination or significant increase in resistance. Thus, in a first aspect this invention provides an electrical device which comprises (1) a resistive element which
   (a) exhibits PTC behavior,
   (b) is composed of a conductive polymer composition comprising a polymeric component, and dispersed therein, a particulate conductive filler,
   (c) has a planar shape with first and second major surfaces, and
   (d) has a thickness of at most 0.649 mm; and
(2) first and second metal foil electrodes
   (a) which are attached to the first and second major surfaces to sandwich the resistive element, and
   (b) at least one of which has a thickness of at least 0.055 mm, said device having
(1) a resistivity at 20° C. of at most 5 ohm-cm; (2) a resistance at 20° C. of at most 5 ohms; and
(3) a ratio of element thickness to electrode thickness of 1:1 to 16:1. In a second aspect, the invention provides an electrical device which comprises
(A) a resistive element which
   (1) exhibits PTC behavior,
   (2) is composed of a conductive polymer composition comprising polyvinylidene fluoride, and dispersed therein, a particulate conductive filler comprising carbon black,
   (3) has a planar shape with first and second major surfaces, and
   (4) has a thickness of at most 0.51 mm; and
(B) first and second electrodes, each of which
   (1) has a thickness of at least 0.060 mm, and
   (2) comprises
     (a) a base layer which comprises a first metal,
     (b) a surface layer which (i) comprises a second metal, (ii) has a center line average roughness $\bar{R}_a$ of at least 1.3, and (iii) has a reflection density $R_d$ of at least 0.60, and
     (c) an intermediate metal layer which (i) is positioned between the base layer and the surface layer, and (ii) comprises a metal which is different from the first metal;
the first and second electrodes being attached to the first and second major surfaces to sandwich the resistive element so that the surface layers thereof are in direct physical contact with the conductive polymer of the resistive element; and said device having
(1) a resistivity at 20° C. of at most 5 ohm-cm;
(2) a resistance at 20° C. of at most 5 ohms; and
(3) a ratio of element thickness to electrode thickness of 6:1 to 10:1.

Devices of the invention are suitable for use in an electrical circuit. Therefore, in a third aspect, the invention provides an electrical circuit which comprises
(1) a source of electrical power;
(2) a load resistance; and
(3) a device according to the first aspect of the invention which is connected in series with the source of electrical power and the load resistance.

DETAILED DESCRIPTION OF THE INVENTION

Figure 1:
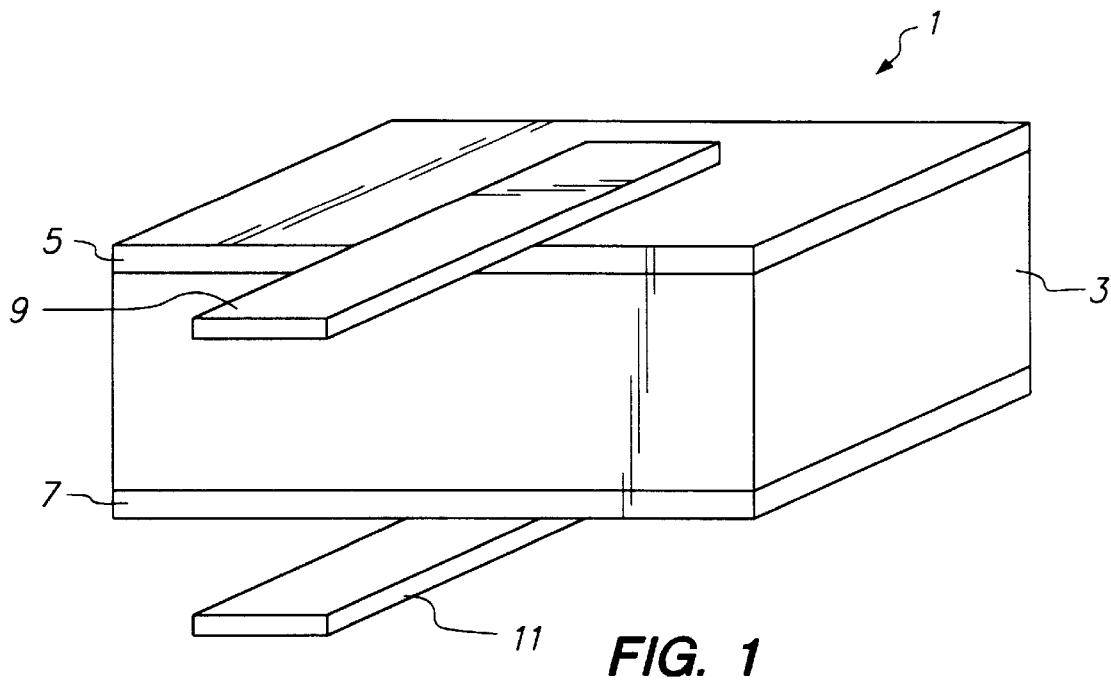
FIG. 1 is a plan view of an electrical device of the invention.

The electrical device of the invention comprises a resistive element composed of conductive polymer composition, and first and second metal foil electrodes which are attached to, and sandwich, the resistive element. The conductive polymer composition comprises a polymeric component, and dispersed therein, a particulate conductive filler. The polymeric component comprises one or more polymers, one of which is preferably a crystalline polymer having a crystallinity of at least 20% as measured in its unfilled state by a differential scanning calorimeter. Suitable crystalline polymers include polymers of one or more olefins, particularly polyethylene such as high density polyethylene; copolymers of at least one olefin and at least one monomer copolymerisable therewith such as ethylene/acrylic acid, ethylene/ethyl acrylate, ethylene/vinyl acetate, and ethylene/butyl acrylate copolymers; melt-shapeable fluoropolymers such as polyvinylidene fluoride (PVDF) and ethylene/tetrafluoroethylene copolymers (ETFE, including terpolymers); and blends of two or more such polymers. For some applications it may be desirable to blend one crystalline polymer with another polymer, e.g. an elastomer or an amorphous thermoplastic polymer, in order to achieve specific physical or thermal properties, e.g. flexibility or maximum exposure temperature. The polymeric component generally comprises 40 to 90% by volume, preferably 45 to 80% by volume, especially 50 to 75% by volume of the total volume of the composition. When the device is to be used in an application in which it will be exposed to low temperature, e.g. −40° C., and then tripped into the high resistance state while still at the low temperature (as is possible for devices used in automotive applications in cold climates), it is preferred that the glass transition temperature of the polymeric component, $T_g$, be at least slightly lower, e.g. at least 2° C. lower, than the specified exposure temperature. This will minimize the effects of expansion as the device trips and passes through $T_g$, and increase the electrical stability of the device during operation at that low temperature. Therefore, for many automotive applications, it is preferred that the polymeric composition comprise a fluoropolymer, e.g. PVDF, or a mixture of two fluoropolymers, e.g. PVDF and ETFE or a terpolymer of ethylene, tetrafluoroethylene, and a third monomer, e.g. perfluorinated-butyl ethylene. Particularly preferred is PVDF prepared by a suspension polymerization technique which produces a polymer with a lower head-to-head defect content (e.g. less than 4.5%) than polymer made by emulsion polymerization, and usually has a higher crystallinity and/or melting temperature. Suitable suspension-polymerized PVDFs are described in U.S. Pat. No. 5,093,898 (van Konynenburg et al), and suitable fluoropolymer mixtures are described in U.S. Pat. No. 5,451,919 (Chu et al), the disclosures of which are incorporated herein by reference.

The particulate conductive filler which is dispersed in the polymeric component may be any suitable material, including carbon black, graphite, metal, metal oxide, conductive coated glass or ceramic beads, particulate conductive polymer, or a combination of these. The filler may be in the form of powder, beads, flakes, fibers, or any other suitable shape. The quantity of conductive filler needed is based on the required resistivity of the composition and the resistivity of the conductive filler itself. For many compositions the conductive filler comprises 10 to 60% by volume, preferably 20 to 55% by volume, and for low resistivity compositions used for low circuit protection devices, especially 25 to 50% by volume of the total volume of the composition.

The conductive polymer composition may comprise additional components, such as antioxidants, inert fillers, non-conductive fillers, radiation crosslinking agents (often referred to as prorads or crosslinking enhancers, e.g. triallyl isocyanurate), stabilizers, dispersing agents, coupling agents, acid scavengers (e.g. $CaCO_3$), or other components. These components generally comprise at most 20% by volume of the total composition.

The composition used in the resistive element exhibits positive temperature coefficient (PTC) behavior, i.e. it shows a sharp increase in resistivity with temperature over a relatively small temperature range. In this application, the term "PTC" is used to mean a composition or device which has an $R_{14}$ value of at least 2.5 and/or an $R_{100}$ value of at least 10, and it is preferred that the composition or device should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range. Generally the compositions used in devices of the invention show increases in resistivity which are much greater than those minimum values. It is preferred that these compositions have a PTC anomaly at at least one temperature over the range from 20° C. to ($T_n$+5° C.) of at least $10^4$, preferably at least $10^{4.5}$, particularly at least $10^5$, especially at least $10^{5.5}$, i.e. the log[resistance at ($T_n$+5° C.)/resistance at 20° C.] is at least 4.0, preferably at least 4.5, particularly at least 5.0, especially at least 5.5, where $T_m$ is the melting temperature of the polymeric component as measured at the peak of the endotherm of a differential scanning calorimeter (DSC) trace. (When there is more than one peak, as for example in a mixture of polymers, $T_m$ is defined as the temperature of the highest temperature peak.) If the maximum resistance is achieved at a temperature $T_x$ that is below ($T_m$+5° C.), the PTC anomaly is determined by the log (resistance at $T_x$/resistance at 20° C.).

Suitable conductive polymer compositions are disclosed in U.S. Pat. No. 4,237,441 (van Konynenburg et al), U.S. Pat. No. 4,545,926 (Fouts et al), U.S. Pat. No. 4,724,417 (Au et al), U.S. Pat. No. 4,774,024 (Deep et al), U.S. Pat. No. 4,935,156 (van Konynenburg et al), U.S. Pat. No. 5,049,850 (Evans et al), U.S. Pat. No. 5,250,228 (Baigrie et al), U.S. Pat. No. 5,378,407 (Chandler et al), U.S. Pat. No. 5,451,919 (Chu et al), and U.S. Pat. No. 5,582,770 (Chu et al), and in commonly assigned U.S. applications Ser. No. 08/701,285 (Chandler et al, filed Aug. 22, 1996), now abandoned in favor of continuation application Ser. No. 08/910,865 which issued as U.S. Pat. No. 5,801,612 Ser. No. 08/789,962 (Wartenberg et al, filed Jan. 30, 1997), now U.S. Pat. No. 5,747,147 and Ser. No. 08/798,887 (Toth et al, filed Feb. 10, 1997). The disclosure of each of these patents and applications is incorporated herein by reference.

The resistive element has a planar shape with first and second major surfaces. The element may be of any configuration, e.g. rectangular, square, or circular. The thickness of the resistive element, i.e. the dimension perpendicular to the first and second major surfaces through which the current flows, is relatively thin, i.e. at most 0.89 mm (0.035 inch), preferably at most 0.76 mm (0.030 inch), particularly at most 0.64 mm (0.025 inch), more particularly at most 0.51 mm (0.020 inch), especially at most 0.38 mm (0.015 inch), e.g. 0.25 mm (0.010 inch). Generally the thickness is at least 0.13 mm (0.005 inch).

The resistive element is sandwiched between first and second electrodes. The electrodes are metal foils which are attached to the first and second major surfaces by compression-molding, nip-lamination, or any other appropriate technique. At least one of the first and second electrodes, and preferably both the first and second electrodes, has a thickness of at least 0.055 mm (0.0021 inch). In order to maximize the thermal properties and the electrical stability of the device, the thickness of the at least one electrode is preferably at least 0.060 mm (0.0024 inch), particularly at least 0.070 mm (0.0028 inch), especially at least 0.080 mm (0.0031 inch), most especially at least 0.125 mm (0.0049 inch). The at least one electrode generally has a thickness of at most 0.25 mm (0.010 inch). In this specification, the thickness of the metal foil is defined as the average thickness. Suitable metal foils include nickel, copper, brass, aluminum, molybdenum, and alloys, or foils which comprise two or more of these materials in the same or different layers. Particularly suitable metal foils have at least one surface that is electrodeposited, preferably electrodeposited nickel or copper, and this electrodeposited surface is physical contact, either directly, or via a tie or adhesive layer, with one of the major surfaces of the resistive element. Appropriate metal foils are disclosed in U.S. Pat. No. 4,689,475 (Matthiesen) and U.S. Pat. No. 4,800,253 (Kleiner et al), the disclosure of which is incorporated herein by reference. Particularly preferred are metal foils such as those disclosed in copending, commonly assigned U.S. application Ser. No. 08/816,471 (Chandler et al, filed Mar. 13, 1997), the disclosure of which is incorporated herein by reference. Those metal foils comprise (a) a base layer which comprises a first metal, e.g. copper; (b) a surface layer which comprises a second metal, e.g. nickel, has a center line average roughness $\overline{R}_a$ of at least 1.3, and a reflection density $R_d$ of at least 0.60, and (c) an intermediate metal layer which is positioned between the base layer and the surface layer, and comprises a metal which is different from the first metal. $\overline{R}_a$ is defined as the arithmetic average deviation of the absolute values of the roughness profile from the mean line or center line of a surface when measured using a profilometer having a stylus with a 5 micron radius. Thus $\overline{R}_a$ is a gauge of the height of protrusions from the surface of the foil. Reflection density, $R_d$, is defined as log (1/% reflected light) when light over the visible range (i.e. 200 to 700 nm) is directed at the surface.

The ratio of the thickness of the resistive element thickness to the electrode thickness is 1:1 to 16:1. For many devices the ratio is preferably 6:1 to 10:1, a ratio which results in decreased delamination and increased electrical stability, especially for devices in which the polymeric component comprises PVDF. When the first and second electrodes have different thicknesses, the thickness of the thicker electrode is used to calculate the ratio. If a tie layer is present, it is considered part of the resistive element thickness.

The resistivity of the device at 20° C., $\rho_{20}$, is preferably low, i.e. at most 5 ohm-cm, preferably at most 2 ohm-cm, particularly at most 1 ohm-cm. The resistance of the device at 20° C., $R_{20}$, is also low, i.e. at most 5 ohms, preferably at most 1 ohm, particularly at most 0.50 ohm, especially at most 0.10 ohm.

Devices of the invention generally comprise first and second electrical leads, which are electrically and physically connected to the first and second electrodes, respectively. Such leads, which may be in form of wires, ribbons, or other suitable configuration, are generally attached to the electrodes by means of solder, welds, or conductive adhesives. The leads allow connection of the device into an electrical circuit.

In order to provide electrical and environmental insulation, an insulating layer which surrounds at least part of, and preferably all of, the resistive element and the first and second electrodes may be present. The insulating layer may be a polymer, e.g. a silicone, a ceramic, or a coated metal, which can be applied by any suitable means, e.g. in the form of a tape or a powder which is subsequently cured. Particularly preferred is epoxy which can be applied in the form of a powder or liquid and be subsequently cured. It is important that the insulating layer not be so rigid that expansion of the resistive element is substantially constrained when the device trips into the high resistance state. Generally the insulating layer covers at least part of the electrical leads.

Preparation of the conductive polymer composition, attachment of the electrodes, and preparation of the device may be achieved by any suitable method. Process steps, e.g. heat-treatment and/or crosslinking are often conducted in order to maximize the electrical stability of the device. Heat-treatment can be conducted in a variety of ways, and certain processes, e.g. solder-dipping or encapsulation, in which the device is exposed to and/or maintained at an elevated temperature, preferably greater than $T_m$, may serve as a heat-treatment. Crosslinking can be accomplished by chemical means or by irradiation, e.g. using an electron beam or a $Co^{60}$ γ irradiation source. The level of crosslinking depends on the required application for the device, but is generally less than the equivalent of 200 Mrads, and is preferably substantially less, i.e. from 1 to 20 Mrads, preferably from 1 to 15 Mrads, particularly from 2 to 10 Mrads for low voltage (i.e. less than 60 volts) applications. The stage of processing during which the device is crosslinked can affect the device resistance. For example, the device can be exposed to a heat-treatment at a temperature above $T_m$ either before or after crosslinking.

Devices of the invention can be used in an electrical circuit in which the device is connected in series with a load resistance and a source of electrical power, e.g. a power supply or a battery. Devices of the invention are particularly useful for applications in which the voltage in the circuit (supplied by the power source) is less than 60 volts, e.g. 16 volts or 30 volts DC. Such applications include "under hood" automotive applications, e.g. wire harness protection such as is described in U.S. Pat. No. 5,645,746 (Walsh).

The invention is illustrated by the drawings in which FIG. 1 shows an electrical device 1 of the invention. Resistive element 3, composed of a conductive polymer composition, is sandwiched between first and second metal foil electrodes 5,7. First and second electrical leads 9,11 are attached to first and second electrodes 5,7, respectively.

Figure 2:
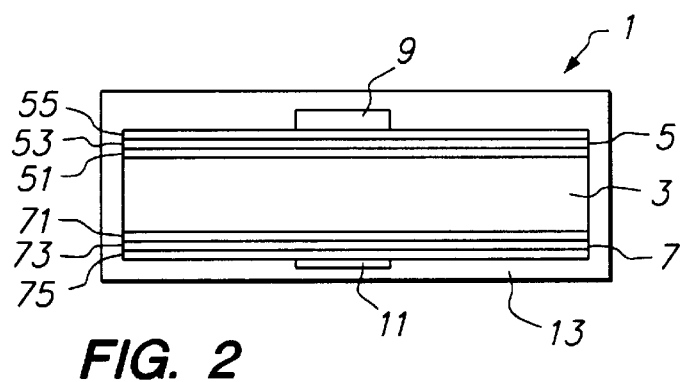
FIG. 2 is a cross-sectional view of an electrical device of the invention.

FIG. 2 is a cross-sectional view of device 1. Resistive element 3 is in contact with surface layer 51 of first electrode 5 and surface layer 71 of second electrode 7. Intermediate layer 53 of first electrode 5 is positioned between surface layer 51 and base layer 55. Intermediate layer 73 of second electrode 7 is positioned between surface layer 71 and base layer 75. First and second electrical leads 9,11 are attached to base layers 55 and 75, respectively. Insulating layer 13 surrounds resistive element 3, first and second electrodes 5,7, and part of first and second leads 9,11.

Figure 3:
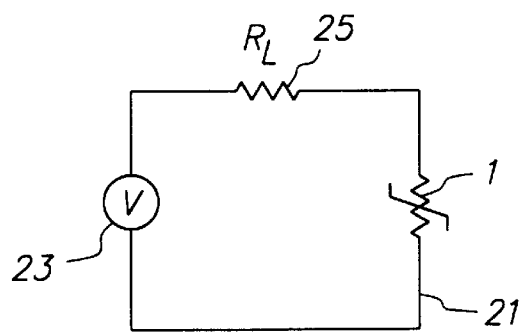
FIG. 3 is a circuit diagram of an electrical circuit of the invention.

FIG. 3 shows circuit 21 in which device 1 is in series with power source 23 and lead resistance 25.

The invention is illustrated by the following examples, in which Example 1 is a comparative example.

Preparation of Laminate

For each of compositions A and B, the following ingredients, in the weight percentages based on the weight of the total composition listed in Table I were mixed at 1500 rpm for three minutes using a Henschel™ mixer: PVDF (KF™ 1000 W, polyvinylidene fluoride in powder form with a melting temperature of about 177° C., available from Kureha), ETFE (Tefzel™ HT 2163, ethylene/ tetrafluoroethylene/perfluorinated butyl ethylene terpolymer with a melting temperature of about 235° C., available from DuPont), CB (Raven™ 430, carbon black, available from Columbian Chemicals), TAIC (triallyl isocyanurate), and $CaCO_3$ (Atomite™ powder, calcium carbonate, available from John K. Bice Co.) The mixed dry ingredients were then fed from separate feeders in approximately a 50:50 ratio to form composition C, which was introduced into a counter-rotating/co-rotating twin-screw extruder (ZSE-27, available from Leistritz) used in a corotation mode, and having a screw configuration in which 11% of the total screw length was kneading elements. The screw had an L:D ratio of 40:1. The extruder was fitted with a gear pump having a capacity of 10 $cm^3$/revolution (Pep II, available from Zenith) and a ribbon die having a dogbone-shaped opening. The molten material was extruded through the die and fed onto a roll stack positioned about 25 mm (1 inch) from the die. The roll stack was used to both calender the material into a sheet with a thickness of about 0.250 mm (0.010 inch) and a width of about 114 to 152 mm (4.5 to 6.0 inches) and to attach metal foil electrodes to both sides of the calendared sheet to form a laminate. The metal foil electrodes used were electrodeposited nickel/copper of the type described as Type 31 in U.S. application Ser. No. 08/816,471 (Chandler et al, filed Mar. 13, 1997), the disclosure of which is incorporated herein by reference, and available from Fukuda. The foil used for Example 1 was 1 oz foil having a thickness of about 0.044 mm +/-0.006 mm and a copper base layer of about 0.035 mm. The foil used for Examples 2 and 3 was 2 oz foil having a thickness of about 0.080 mm +/-0.010 mm and a copper base layer of about 0.070 mm.

TABLE I

Composition in weight % (density in g/$cm^3$)

| Composition | A | B | C |
|---|---|---|---|
| PVDF (1.76) | 56.43 | 54.67 | 55.55 |
| ETFE (1.70) | 6.27 | 6.07 | 6.17 |
| CB (1.8) | 33.32 | 35.28 | 34.30 |
| TAIC (1.158) | 2.00 | 2.00 | 2.00 |
| $CaCO_3$ (2.71) | 1.98 | 1.98 | 1.98 |

Device Preparation

For Examples 1 to 3, the laminate was irradiated to a total of 7.5 Mrad using a $Co^{60}$ γ irradiation source. The laminate was then coated in a continuous process with 96/4 Sn/Ag solder (using a solder temperature of about 255–260° C.), and devices with dimensions of 20.3×24.5 mm (0.8×1.0 inch) were punched from the laminate. Two 20 AWG tin-coated copper leads about 25 mm (1 inch) long were attached to each device with 96/4 Sn/Ag solder, and the devices were then encapsulated by dipping them into Hysol™ DK-29 powdered epoxy, which was cured at 150° C. for 1 hour. The devices were then thermally cycled six times, each cycle being from 40 to 160 to 40° C. at a rate of 5° C./minute with a 30 minute dwell at the temperature extremes.

For Example 4, devices with dimensions as above were punched from laminate that had been solder-coated in a continuous process as above. The devices were then irradiated as discrete pieces. Leads were attached and the devices were encapsulated and temperature cycled as above.

Devices were tested for cycle life, trip endurance, and process jump.

Cycle Life

Devices were tested in a circuit consisting of the device in series with a switch, a DC power supply of 16 volts, and a fixed resistor that limited the initial current to 100 A. Five to ten devices were placed in an environmental chamber maintained at −40° C. Each cycle consisted of applying power to the circuit for 6 seconds to trip the device into the high resistance state, and then turning the power off for 120 seconds. At intervals (e.g. after cycle x), the voltage was removed, the devices were cooled for one hour, and the resistance at 20° C. was measured. The normalized resistance, $R_n$, i.e. (the resistance at 20° C. measured after cycle x, $R_x$/the initial resistance at 20° C., $R_i$), was reported. As shown in Table II, devices with the thicker foil had a substantially lower $R_n$ value after 100 cycles, and after 300 cycles, no devices with 2 oz foil had failed the test by burning.

Trip Endurance

Devices were tested in a circuit consisting of the device in series with a switch, a DC power supply of 16 volts, and a fixed resistor that limited the initial current to 40 A. The device was tripped into the high resistance state and maintained in the high resistance state for 24 hours. The power was then removed, the device was allowed to cool for one hour and the resistance at 20° C. was measured. The normalized resistance, $R_n$, was determined. As shown in Table II, the device with the thicker foil had a substantially lower $R_n$ value.

Process Jump

During the extrusion-lamination procedure, samples with a diameter of 6.4 mm (0.25 inch) were punched from the laminate. The resistance of these samples at 20° C., $R_0$, was measured five minutes after the samples were punched, and the resistivity, $\rho_0$, was calculated. Following all processing for the devices of Examples 1, 3, and 4, the resistance at 20° C., $R_f$, was measured and the resistivity, $\rho_f$, was calculated. The ratio of $R_f$ to $R_0$ was calculated to determine the effects of processing on resistance. As shown in Table II, the devices with thicker foil had a smaller increase in resistance after processing, and, as shown by Example 4, the devices which were irradiated following solder-coating and punching, had a significant resistance decrease, allowing preparation of devices with lower resistance.

PTC Anomaly

Devices were placed in an oven which was increased in temperature over the range 20 to 200° C. at a rate of about 3°/minute. The resistance of each device was measured at intervals. The PTC anomaly (in decades) was determined as (Resistance at about 175° C.)/(Resistance at 20° C.).

TABLE II

| Example | 1* | 2 | 3 | 4 |
|---|---|---|---|---|
| Foil type (oz) | 1 | 2 | 2 | 2 |
| Cycle Test | | | | |
| $R_i$ (ohms) | 0.0067 | 0.0091 | | |
| $R_{100}$ (ohms) | 0.0185 | 0.0109 | | |
| $R_{100}/R_i$ | 2.8 | 1.2 | | |
| % failure after 300 cycles | 40% | 0% | | |
| Trip Endurance | | | | |
| $R_i$ (ohms) | 0.0060 | | 0.0063 | |
| $R_{24hours}$ (ohms) | 0.0154 | | 0.0117 | |
| $R_n$ | 2.58 | | 1.87 | |
| Process Jump | | | | |
| $\rho_0$ (ohm-cm) | 0.95 | | 0.94 | 0.94 |
| $\rho_f$ (ohm-cm) | 1.22 | | 1.18 | 0.84 |
| $R_f/R_i$ | 1.28 | | 1.26 | 0.89 |
| PTC Anomaly (decades) | 4.9 | 4.7 | 4.9 | 5.8 |

*Indicates a comparative example.

The foregoing detailed description of the invention includes passages which are chiefly or exclusively concerned with particular parts or aspects of the invention. It is to be understood that this is for clarity and convenience, that a particular feature may be relevant in more than just the passage in which it is disclosed, and that the disclosure herein includes all the appropriate combinations of information found in the different passages.

What is claimed is:

1. An electrical device which comprises
   (A) a resistive element which
      (1) exhibits PTC behavior,
      (2) is composed of a conductive polymer composition comprising polyvinylidene fluoride, and dispersed therein, a particulate conductive filler comprising carbon black,
      (3) has a planar shape with first and second major surfaces, and
      (4) has a thickness of at most 0.51 mm ; and
   (B) first and second electrodes, each of which
      (1) has a thickness of at least 0.060 mm, and
      (2) comprises
         (a) a base layer which comprises a first metal,
         (b) a surface layer which (i) comprises a second metal, (ii) has a center line average roughness $\overline{R}_a$ of at least 1.3, and (iii) has a reflection density $R_d$ of at least 0.60, and
         (c) an intermediate metal layer which (i) is positioned between the base layer and the surface layer, and (ii) comprises a metal which is different from the first metal, the first and second electrodes being attached to the first and second major surfaces to sandwich the resistive element so that the surface layers thereof are in direct physical contact with the conductive polymer of the resistive element; and said device having
      (1) a resistivity at 20° C. of at most 5 ohm-cm;
      (2) a resistance at 20° C. of at most 5 ohms; and
      (3) a ratio of element thickness to electrode thickness of 6:1 to 10:1.

2. A device according to claim 1 wherein the base layer comprises copper and the surface layer comprises nickel.

3. A device according to claim 1 wherein the resistive element has been crosslinked.

4. A device according to claim 1 wherein the polyvinylidene fluoride has been made by a suspension polymerization technique.

5. A device according to claim 1 which further comprises an insulating layer surrounding at least part of the resistive element and the first and second electrodes.

6. A device according to claim 5 wherein the insulating layer is an epoxy or a silicone.

7. A device according to claim 1 which further comprises a first electrical lead attached to the first electrode and a second electrical lead attached to the second electrode.

* * * * *